United States Patent
Fontana et al.

[19]
[11] Patent Number: 6,075,718
[45] Date of Patent: Jun. 13, 2000

[54] METHOD AND DEVICE FOR READING A NON-ERASABLE MEMORY CELL

[75] Inventors: Marco Fontana, Milan; Antonio Barcella, Trescore Balneario; Massimo Montanaro, Pavia; Carmelo Paolino, Palermo, all of Italy

[73] Assignee: STMicroelectronics, S.r.l., Agrate Brianza, Italy

[21] Appl. No.: 09/039,588

[22] Filed: Mar. 16, 1998

[30] Foreign Application Priority Data

Mar. 18, 1997 [IT] Italy ................................. T097A0227

[51] Int. Cl.[7] ................................................. G11C 17/00
[52] U.S. Cl. ................................. 365/94; 365/49; 365/210
[58] Field of Search ............................... 365/49, 94, 104, 365/191, 210

[56] References Cited

U.S. PATENT DOCUMENTS

| | | | |
|---|---|---|---|
| 4,803,659 | 2/1989 | Hallenbeck | 365/94 |
| 5,177,375 | 1/1993 | Ogawa et al. | 307/272.3 |
| 5,774,402 | 6/1998 | Lee | 365/191 |

*Primary Examiner*—David Nelms
*Assistant Examiner*—Van Thu Nguyen
*Attorney, Agent, or Firm*—Seed and Berry LLP; David V. Carlson

[57] ABSTRACT

The method comprises the steps of detecting the trailing edge of an initialization signal, and generating a read bias signal and a read activation signal for the cell, when the trailing edge of the initialization signal is detected. The signals of read bias and read activation have a ramp-like leading edge and both signals are disabled when reading of the cell is completed. Thereby, phenomena of soft-writing of the cell are avoided, and risks of erroneous readings are reduced.

30 Claims, 4 Drawing Sheets

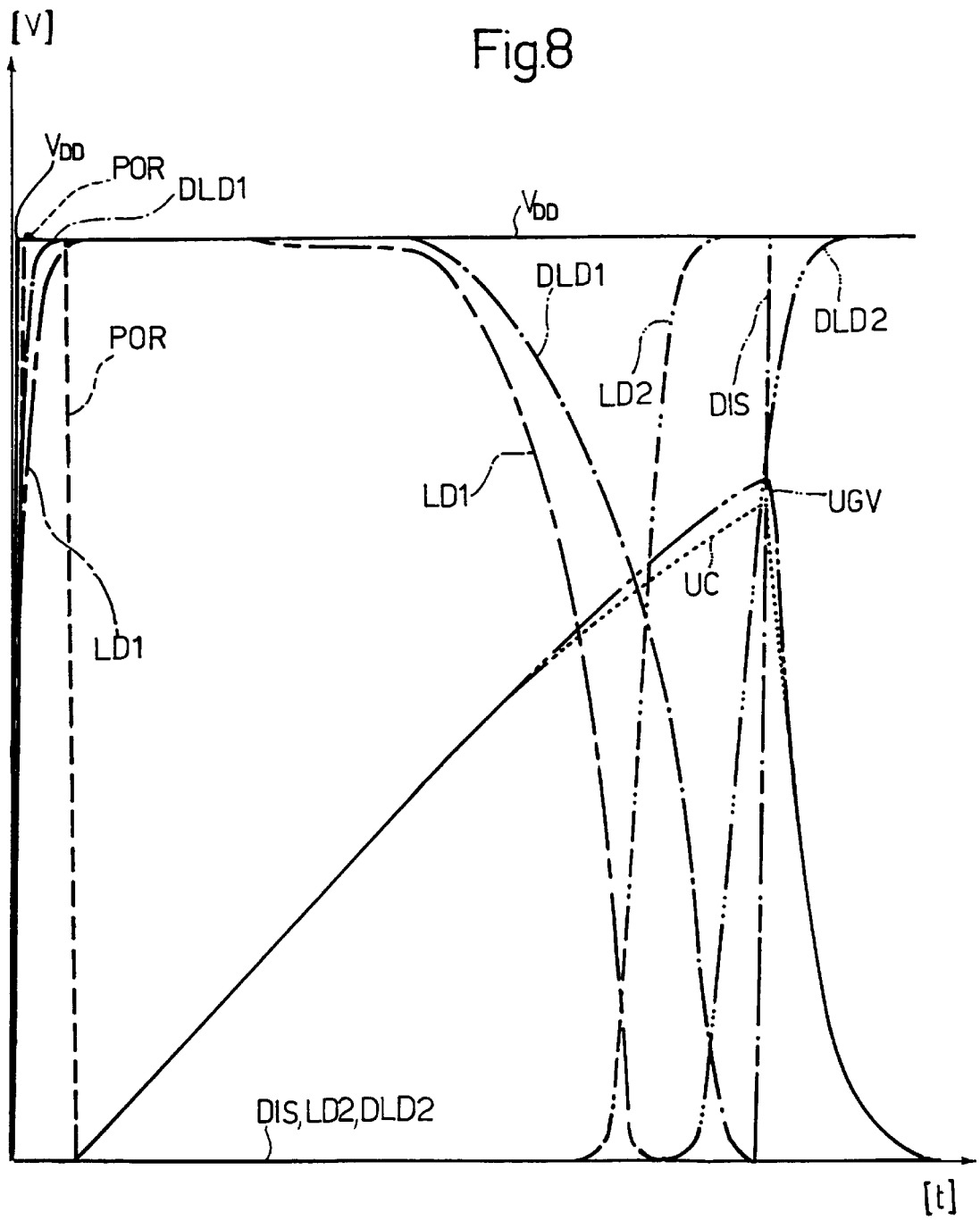

METHOD AND DEVICE FOR READING A NON-ERASABLE MEMORY CELL

TECHNICAL FIELD

The present invention relates to a method and a device for reading a non-erasable memory cell.

BACKGROUND OF THE INVENTION

As is known, many electronic devices can have their architecture re-configured, during manufacturing, by programming non-erasable memory cells, also known as CAM cells.

For example, some types of non-volatile memories (EPROMs, EEPROMs, Flash, etc.) allow replacement of defective lines or columns of a memory array by others, that are so called "redundant," to restore full functioning of the memory array. In this case, data concerning the presence of defective lines or columns and their position is stored in the aforementioned CAM cells, which are read in a power-up step of the memory, i.e., in the step in which the power is switched on.

CAM cells are generally organized in an array and are read using a reading device of the type shown in FIG. 1.

In FIG. 1, the reading device 1 comprises a plurality of cell read circuits 2, to read respective data cells 4, a read detection circuit 8 for detecting reading of the data cells 4, and a control circuit 10 for controlling cell read circuits 2 and read detection circuit 8.

Each cell read circuit 2, which is called hereinafter BCAM circuit 2, has a first input terminal 2a receiving a POR (Power On Reset) initialization signal supplied to output 6o by a generator circuit 6 (which is not part of the reading device 1 and is therefore not described in detail), with the purpose of detecting activation of the supply of reading device 1, or a loud noise on the supply line (a so-called "bump"). BCAM circuit 2 also has a second input terminal 2b connected to control circuit 10, and an output terminal 2o supplying, at the reading step, the data contained in the respective data cell 4.

Read detection circuit 8 has a first input terminal 8a connected to output terminal 6o of generator circuit 6, a second and a third input terminal 8b, 8c connected to control circuit 10, and an output terminal 8o which supplies a deactivation signal DIS to control circuit 10.

Control circuit 10, which is not shown in detail, has a first input terminal 10a which is connected to output terminal 6o of generator circuit 6; a second input terminal 10b connected to output terminal 8o of read detection circuit 8; a first output terminal 10o supplying a read activation signal UGV and connected to the second input terminal 8b of read detection circuit 8 and to data cells 4; and a second output terminal 10u supplying a read bias signal UC and connected to the third input terminal 8c of the read detection circuit 8 and to the second input terminal 2b of BCAM circuit 2.

Each data cell 4 preferably comprises a CAM cell that stores a binary datum (bit), the logic value of which (0 or 1) depends on whether the cell is written or virgin. Each data cell 4 has a drain terminal 4a, a source terminal 4b connected to ground, and a gate terminal 4c connected to the first output terminal 10o of control circuit 10, from which it receives read activation signal UGV.

Each BCAM circuit 2 comprises a data read bias circuit 16, a data storage circuit 18 and an initialization circuit 20, as well as programming bias circuits which are not shown.

Data read bias circuit 16 comprises an NMOS transistor having a drain terminal connected to a node LD1, a source terminal connected to the drain terminal 4a of the data cell 4, and a gate terminal connected to the second input terminal 2b of BCAM circuit 2.

Data storage circuit 18 comprises a first and a second inverter 22, 24 connected to one another back-to-back; in particular first inverter 22 is connected at its input to a node LD2 and at its output to a node LD1, and second inverter 24 is connected at its input to node LD1 and at its output to node LD2; node LD2 is also connected to output terminal 2o of BCAM circuit 2.

Initialization circuit 20 comprises an NMOS transistor having a drain terminal 20a connected to the node LD2, a source terminal 20b connected to ground, and a gate terminal 20c connected to the first input terminal 2a of BCAM circuit 2.

Read detection circuit 8 comprises a virgin, non-erasable reference cell 30, for example a dummy CAM cell, and a reference read cell 32 which is substantially identical to the above-described BCAM circuit 2, and is called hereinafter as dummy circuit 32.

In particular, dummy circuit 32 comprises a reference read bias circuit 34; a reference storage circuit 36 including two inverters 37 and 39 similar to inverters 22 and 24, and having an input node DLD1 and an output node DLD2; and an initialization circuit 38.

Dummy circuit 32 also includes a delay circuit 40, which for example comprises a plurality of inverters 42, and is connected between node DLD2 and output terminal 8o of read detection circuit 8.

Reading device 1 functions as follows.

As shown in FIG. 2, when power is switched on, generator circuit 6 generates a pulse which initializes the circuits of reading device 1; in particular initialization signal POR generated by the generator circuit switches to the high logic state, following initially the transient of supply voltage $V_{DD}$. This pulse initializes data storage circuit 18 and reference storage circuit 36, switching on transistors 20 and 38 and causing the potential of output nodes LD2 and DLD2 to be close to ground (low logic state), and brings the potential of the input nodes LD1 and DLD1 to high level (high logic state). In the example illustrated, the high logic state of input node LD1 of data storage circuit 18 corresponds to a written data cell 4.

In this initialization step, read bias signal UC and deactivation signal DIS are in the low logic state, whereas read activation signal UGV, which is initially in the low logic state, has an edge that rises steeply to a high logic state that is substantially the same as that of the supply voltage $V_{DD}$.

The initialization step of reading device 1 ends when initialization signal POR switches once again to low, giving rise to bias activation of data cell 4 and beginning of the step of reading data cell 4.

In particular, after initialization signal POR switches to low, control circuit 10 switches read bias signal UC to high, activating NMOS transistor 16, which then connects the drain terminal 4a of data cell 4 to input node LD1 of data storage circuit 18, thus biasing data cell 4.

The dimensions of the first inverter 22 are such that if data cell 4 is virgin, the current absorbed by the latter causes switching of node LD1 from the high logic state to the low logic state, whereas if data cell 4 is written, no switching of node LD1 takes place.

Simultaneously, substantially same events as those above described take place in read detection circuit 8, with the difference that since reference cell 30 is virgin, node DLD1 definitely switches, indicating that reference cell 30 has been read. This switching is propagated with a delay, via inverter 37 and delay circuit 40, to the output of read detection circuit 8, producing switching of deactivation signal DIS to the high logic state.

The object of introducing this delay is to ensure that all virgin data cells 4 are read, including those in which the read current required to switch node LD1 is reached more slowly, because of unintentional physical implementation differences or of a position making slower cell biasing. Consequently, switching of deactivation signal DIS shows with certainty that reading of all data cells 4 has taken place.

Deactivation signal DIS is switched by control circuit 10, which, if other functions are not activated, switches to the low logic state the read bias signal UC, which stops the read step of data cell 4, whereas read activation signal UGV remains high.

The sequence of the above-described events is determined by an "inherent" timing of reading device 1, i.e., by the duration of the initialization signal POR and the delay of the leading edge of deactivation signal DIS, compared with the leading edge of read bias signal UC.

This timing gives rise to the effects indicated, only if the initial transient on the supply line (rising ramp of supply voltage $V_{DD}$) has a short duration with respect to the time constants associated with the internal nodes of reading device 1. On the other hand, if the initial transient on the supply line is lengthy, the events described take place whilst supply voltage $V_{DD}$ is still increasing towards the final value, and the sequence of events is no longer caused by the "inherent" timing of the reading device, but is dependent on a so-called "trigger voltage levels" of the circuits of reading device 1 (i.e., on a minimum supply voltage which, when supplied to a circuit, allows the latter to be switched, if it should be, from one logic state to the other).

If the initial transient on the supply line is lengthy, and the sequence of events depends on the so-called "trigger voltage levels" of the circuits, it is nevertheless possible to obtain the sequence of events illustrated in FIG. 2, if the following conditions have occurred:

zero trigger voltage of generator circuit 6 is lower than zero trigger voltage of read detection circuit 8; In particular, the term zero trigger voltage of generator circuit 6 indicates the minimum supply voltage which causes switching of generator circuit 6, thus producing the trailing edge of the initialization signal POR, whereas the term zero trigger voltage of read detection circuit 8 indicates the minimum supply voltage which, when signals UGV and UC have an equal value to the supply voltage $V_{DD}$, enables reference cell 30 to take to the low logic state node DLD1 previously initialized to the high logic state, thus producing the leading edge of deactivation signal DIS;

minimum read voltage of a virgin data cell 4 is lower than zero trigger voltage of read detection circuit 8, where the term minimum read voltage of a data cell 4 indicates the minimum supply voltage $V_{DD}$ which, when signals UGV and UC have an equal value to the supply voltage, gives rise to switching of node LD1 from high, to which it has previously been initialized, to low. This ensures that when the read step is completed, all virgin data cells 4 have actually been read.

The latter condition can be obtained by introducing in dimensional or structural differences into the components carrying out the same function in read detection circuit 8 and in BCAM circuits 2. For example, reference cell 30 can have a switching-on threshold voltage greater than data cells 4, or read activation signal UGV supplied to reference cell 30 can be lower than read activation signal UGV supplied to data cells 4. However both solutions have disadvantages, which are associated with the loss of correlation involved in variations of structural features of the data cells and the reference cell, and their deterioration in the long term.

The above-described reading device 1 has some disadvantages associated mainly with the timing of read bias signals UC and read activation signals UGV, and with the presence of steep leading edges of the signals.

In particular, the steep leading edge of read bias signals UC and read activation signals UGV gives rise to "fast" biasing of drain terminal 4a, and, respectively, of gate terminal 4c of data cells 4, which can be problematic if the supply lines are noisy, as is often the case in the power-up step, or when a somewhat high (6–7 V) supply voltage $V_{DD}$ is being used, since when they are switched to high, read bias signal UC and read activation signal UGV follow a behavior which coincides with the trend of supply voltage $V_{DD}$.

In fact, an excessively high value of read activation signal UGV applied to the gate terminal 4c of a data cell 4 can be such that it leads to exceeding the conduction threshold voltage of the data cell 4, consequently generating a current which, although lower than that of a virgin data cell 4, can be sufficient to switch the data storage circuit 18 connected thereto, thus causing erroneous reading of the content of data cell 4, which cannot be corrected as long as power is on.

In addition, the high logic state of read activation signal UGV on gate terminal 4c of data cell 4, simultaneously with the initialization pulse, can cause conditions which are potentially dangerous for the data cell 4 in presence of undesirable electric fields, for example during electrostatic discharge on the integrated circuit pin connected to supply voltage $V_{DD}$, thus reducing reliability of data cell 4.

Finally, immediate conduction of NMOS transistor 16, caused by the steep switching edge of read bias signal UC, gives rise to instantaneous connection between node LD1 and drain terminal 4a of data cell 4, and thus to an electric charge transfer from node LD1 (associated to an equivalent capacity charged to level 1) to drain terminal 4a (associated to an equivalent capacity charged to level zero). In case of fast activation of NMOS transistor 16, this charge transfer (also known as "charge sharing") can be sufficient to reduce significantly the voltage of node LD1, thus causing erroneous switching of data storage circuit 18 and of the voltage of node LD1 from the high logic state to the low logic state, with consequent erroneous reading of data cell 4.

SUMMARY OF THE INVENTION

Embodiments of the present invention provide a method and device for reading a non-erasable memory cell which are reliable and can supply a correct cell reading.

One embodiment of the present invention includes a method for reading a non-erasable memory cell, said method comprising detecting a predetermined switching edge of an initialization signals generating a read activation signal after said predetermined switching edge of the initialization signal is detected, and generating a read bias signal when said predetermined switching edge of said initialization signal is detected.

Another embodiment of the present invention includes a device for reading a non-erasable memory cell, comprising a control circuit and a cell read circuit. The control circuit has a first input receiving an initialization signal, a first output supplying a read activation signal, and a second output supplying a read bias signal, said control circuit being structured to supply said read activation signal and said read bias signal in response to detecting a predetermined switching edge of the initialization signal. The cell read circuit reads a logic state of the non-erasable memory in response to the read activation and read bias signals, said cell read circuit being connected to said control circuit and having an output providing a reading result of the respective memory cell.

BRIEF DESCRIPTION OF THE DRAWINGS

FIG. 8 shows temporal plots obtained with the device according to the present invention.

DETAILED DESCRIPTION OF THE INVENTION

For understanding the present invention, a preferred embodiment is now described purely by way of non-limiting example, with reference to the attached drawings. One embodiment of a reading method according to the present invention is now described with reference to FIG. 3.

In particular, initially, initialization signal POR switches to the high logic state, following initially the transient of supply voltage $V_{DD}$.

In this initialization step, read bias signal UC, read activation signal UGV, and deactivation signal DIS are low.

On completion of the initialization step, initialization signal POR switches once more to low, giving rise to switching of read activation signal UGV and of read bias signal UC to the high state, through a slow ramp leading edge, i.e., with a temporal duration which is greater than the time constants associated with the nodes of reading device 1.

In addition, read bias signal UC initiates the ramp slightly later than read activation signal UGV.

At the end of reading data cells 4, deactivation signal DIS switches to the high logic state, giving rise after a short period of time to switching of read activation signal UGV and of read bias signal UC to the low logic state.

Figure 3:
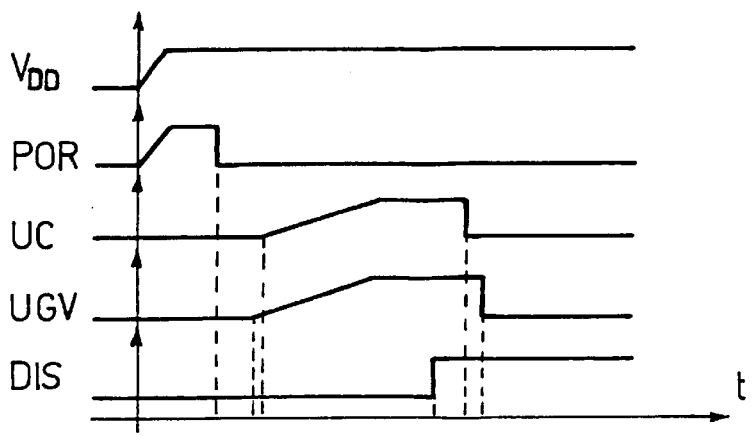
FIG. 3 shows temporal plots which can be obtained through the method according to the present invention.

In the timing of FIG. 3, the slow increase in read bias signal UC after completion of the initialization signal pulse POR makes it possible to switch on gradually MOS transistor 16, and to slow down considerably electric charge transfer from node LD1 to drain terminal 4a of data cell 4, thus preventing rapid descent of node LD1, and therefore reducing substantially the possibility of erroneous reading of the content of the data cell 4.

The slow increase in the read activation signal UGV only after the trailing edge of initialization signal POR makes it possible to prevent data cell 4 being switched on erroneously if there is noise on the supply lines or if high supply voltages are used, thus further reducing the possibility of erroneous reading.

In addition, switching of read activation signal UGV to high only after completion of the initialization signal pulse POR and subsequent switching to low after switching of deactivation signal DIS, increases substantially the reliability of data cell 4, since this prevents the occurrence of conditions which are potentially dangerous for data cell 4, in presence of undesirable electric fields, for example during electrostatic discharge onto the integrated circuit pin connected to supply voltage $V_{DD}$.

The above-described timing method can be advantageously implemented by a reading device 1' shown in FIGS. 4–7.

Figure 4:
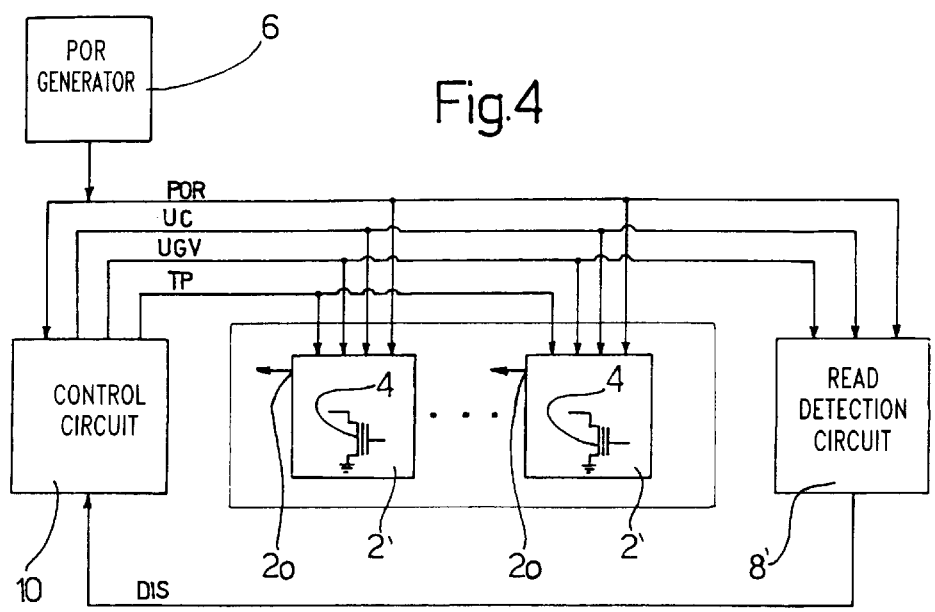
FIG. 4 shows a block diagram of the present reading device.
Figure 2:
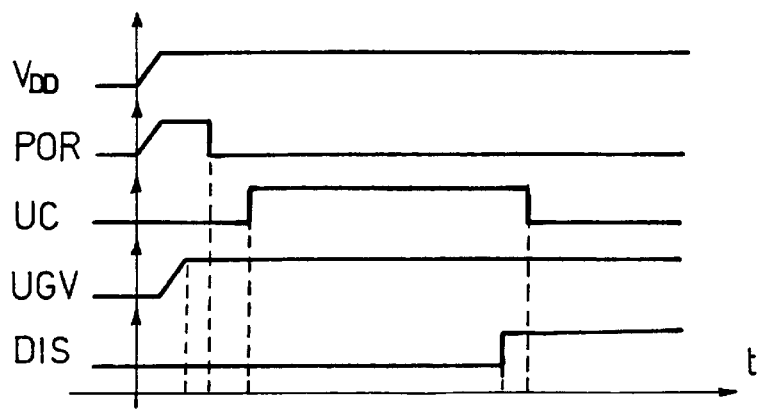
FIG. 2 shows known temporal plots of signals relating to the reading device of FIG. 1.

In detail, reading device 1' of FIG. 4, comprises a plurality of BCAM circuits 2', a read detection circuit 8' and a control circuit 10'.

In particular, read detection circuit 8' is physically positioned such that its distance from control circuit 10' is greater than its distance from BCAM circuits 2'. Thereby deactivation signal DIS travels along a propagation path towards control circuit 10', which is longer than that travelled by the datum read in data cell 4, thus contributing toward ensuring that all virgin data cells 4 are correctly read.

Figure 5:
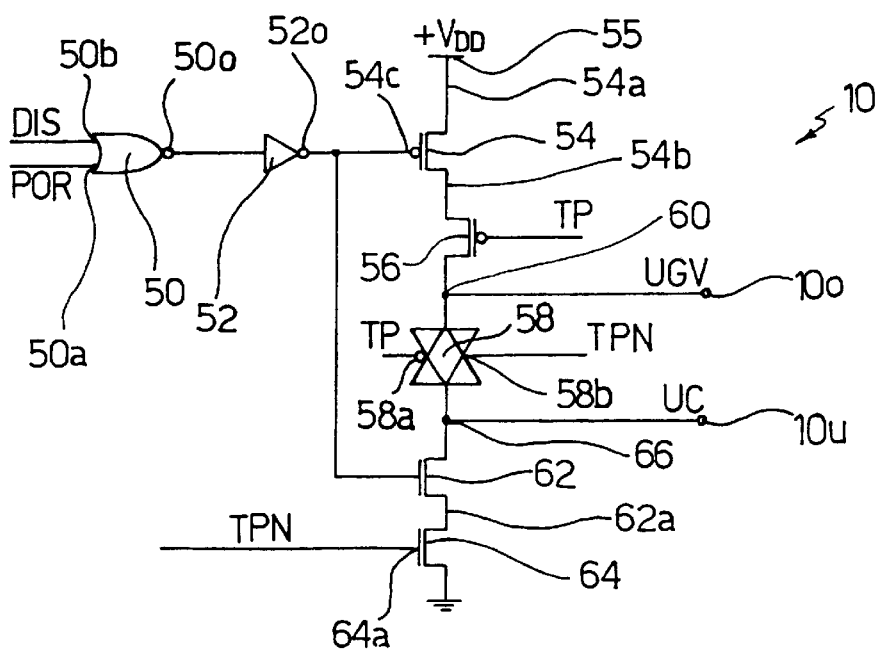
FIGS. 5, 6, 7 show electrical circuit diagrams of the reading device of FIG. 4.

FIG. 5 shows the electric diagram of control circuit 10', comprising a NOR gate 50; an inverter 52 and a plurality of switches 54, 56, 58, 62 and 64.

In detail, NOR gate 50 has a first input 50a connected to the first input terminal 10a of control circuit 10' from which it receives the initialization signal POR, a second input 50b connected to the second input terminal 10b of control circuit 10' from which it receives the deactivation signal DIS, and an output 50o; inverter 52 has an input connected to output 50o of NOR logic gate 50, and an output 52o.

Switch 54 comprises a first PMOS transistor having a source terminal 54a connected to a supply line 55 set to supply voltage $V_{DD}$, a drain terminal 54b and a gate terminal 54c connected to the output 52o of inverter 52. Switch 56 comprises a second PMOS transistor having a source terminal connected to the drain terminal 54b of first PMOS transistor 54, a drain terminal connected to a node 60, and a gate terminal 56c receiving a write bias signal TP. Switch 58 comprises a controlled CMOS switch interposed between node 60 and a node 66, and has a first and a second control terminal 58a, 58b receiving respectively the write bias signal TP and an inverted write bias signal TPN. Node 60 is connected to the first output terminal 10o of control circuit 10' on which read activation signal UGV is present.

Switch 62 comprises a first NMOS transistor having a drain terminal connected to node 66, a source terminal 62a and a gate terminal connected to output terminal 52o of inverter 52. Switch 64 comprises a second NMOS transistor having a drain terminal connected to source terminal 62a of first NMOS transistor 62, a source terminal connected to ground, and a gate terminal 64a receiving the inverted write bias signal TPN. Node 66 is connected to the second output terminal 10u of control circuit 10 on which read bias signal UC is present.

During reading, write bias signal TP assumes a low logic state and inverted write bias signal TPN assumes a high logic state. Consequently, second PMOS transistor 56 is on, controlled CMOS switch 58 is closed, and second NMOS transistor 64 is on.

During initialization, the high logic level of initialization signal POR keeps first PMOS transistor 54 off and first NMOS transistor 62 on, and nodes 60 and 66 grounded. On completion of the initialization step, both initialization POR and deactivation DIS signals have a low logic state, switching on first PMOS transistor 54 and switching off first NMOS transistor 62. Nodes 60 and 66 are therefore charged to supply voltage $V_{DD}$. In particular, dimensions of first PMOS transistor 54 are such that it behaves in a resistive manner and that the charging speed of nodes 60, 66 is limited. Therefore, read activation signal UGV and read bias signal UC have a slow ramp-like leading edge, as illustrated in FIG. 3. In addition, the connection of node 66 to the supply through controlled CMOS switch 58 ensures that read bias signal UC is slightly delayed or almost simultaneous with read activation signal UGV (but is never before it).

On completion of reading, when deactivation signal DIS switches to the high logic state, first PMOS transistor 54 gets off and nodes 60 and 66 are discharged quickly to ground starting from node 66, leading to the low logic state. Thereby read bias signal UC is delayed compared with read activation signal UGV during the charging step, and is in advance during the discharging step, ensuring that drain terminal 4a of data cells 4 is biased only in presence of the read voltage on the gate terminal 4c of data cells 4, thus preventing soft-writing phenomena.

Figure 1:
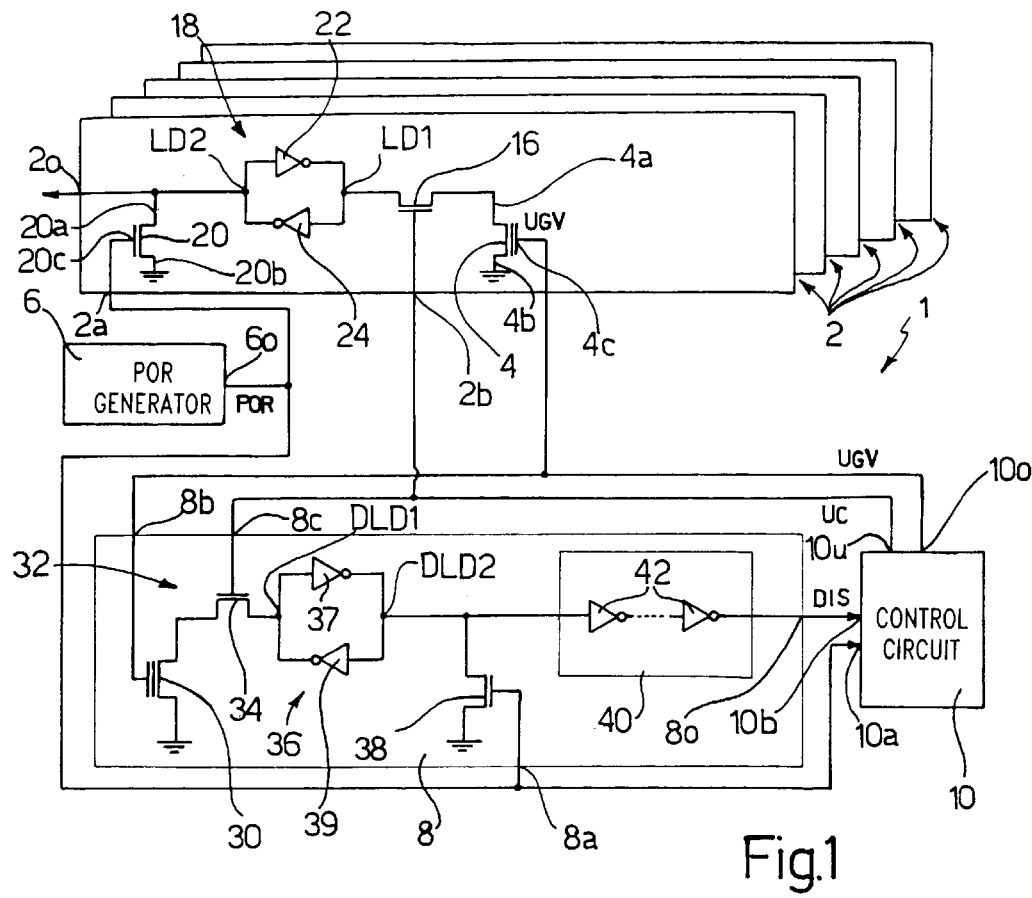
FIG. 1 shows a circuit diagram of a known reading device.
Figure 6:
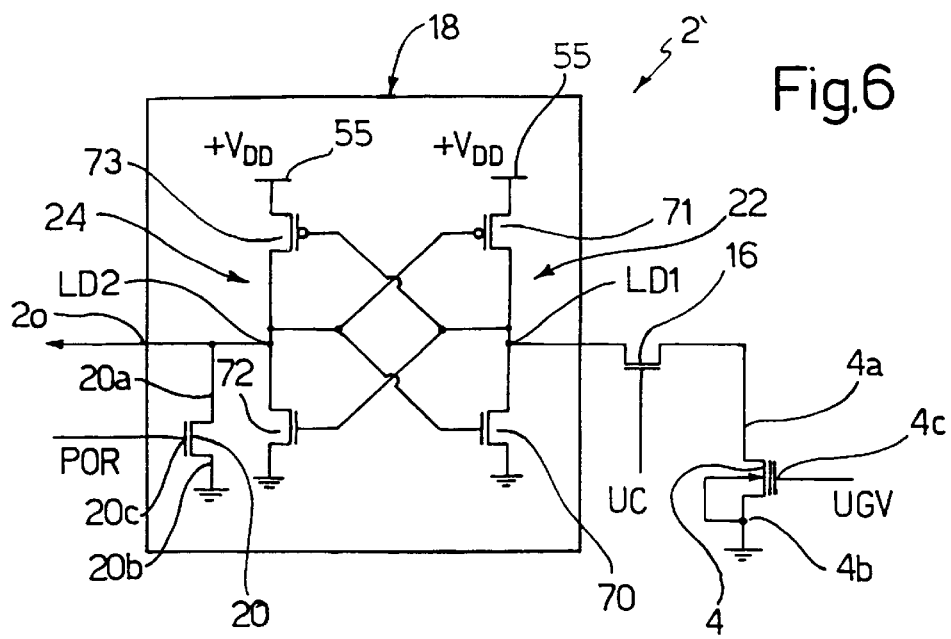
Figure 7:
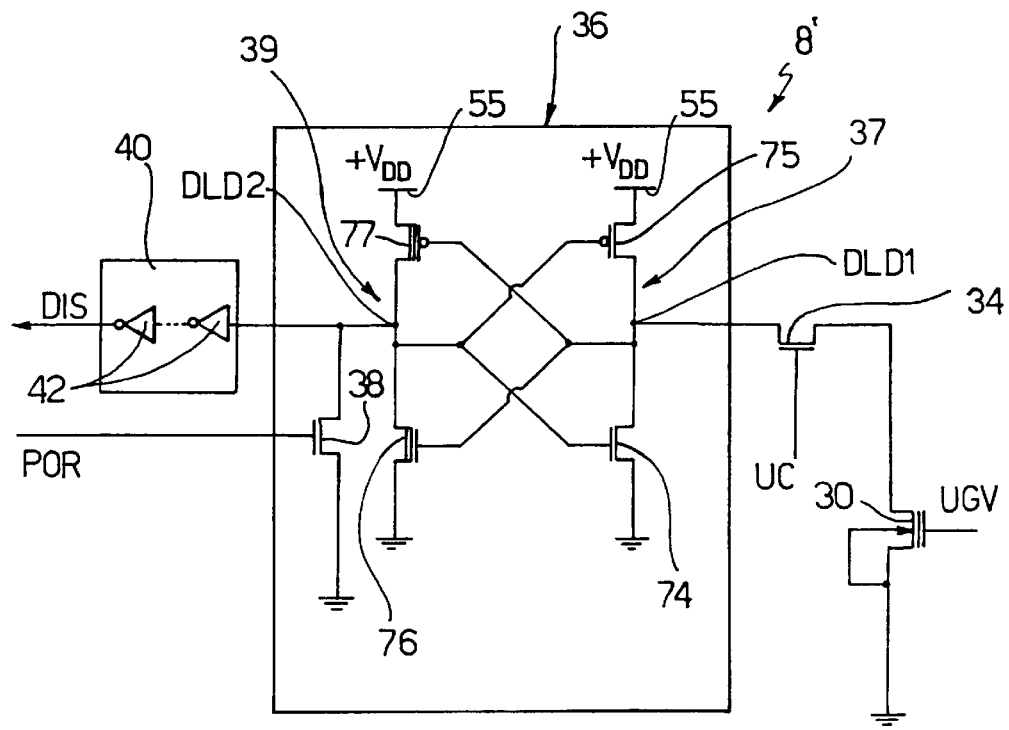

FIGS. 6 and 7 illustrate electrical diagrams respectively of BCAM circuit 2' and read detection circuit 8', showing in greater detail data storage circuit 18 and reference circuit 36' corresponding to the data storage circuit 18 and reference circuit 36 of FIG. 1.

In particular, inverters 22', 24' of data storage circuit 18' and inverters 37, 39 of reference circuit 36' comprise latches. The inverters 22', 24' include pulldown NMOS transistors 70 and 72 and pull-up PMOS transistors 71 and 73. Likewise, the inverters 37', 39' include pull-down NMOS transistors 74, 76 and pull-up PMOS transistors 75, 77. In detail NMOS transistors 70, 72, 74, 76 have all source terminals connected to ground and PMOS transistors 71, 73, 75, 77 have their source terminals connected to supply line 55. Transistors 70 and 71 of inverter 22' have gate terminals connected together and to node LD2, and drain terminals connected together and to node LD1. Transistors 72 and 73 of inverter 24' have gate terminals connected together and to node LD1, and drain terminals connected together and to node LD2. Transistors 74 and 75 of inverter 37 have gate terminals connected together and to node DLD2, and drain terminals connected together and to node DLD1. Transistors 76 and 77 of inverter 39 have gate terminals connected together and to node DlD1, and drain terminals connected together and to node DlD2.

In particular, transistors 70–75 are of the implanted type, whereas transistors 76 and 77 are of the natural type.

Consequently the following relationships apply:

$V_{tN,nat} < V_{tN,imp}$ $V_{tP,imp} < V_{tP,nat}$ wherein $V_{tN,nat}$ is a threshold value of a natural NMOS transistor, $V_{tN,imp}$ is a threshold value of an implanted NMOS transistor, $V_{tP,imp}$ is a threshold value of an implanted PMOS transistor, and $V_{tP,nat}$ is a value of a natural PMOS transistor.

With a same size of the transistors, this solution makes it possible to obtain a zero trigger voltage of inverter 39' of read detector circuit 8' which is lower than that of inverter 24' of BCAM circuits 2'. Consequently, with a same voltage reduction speed on nodes LD1 and DLD1, node DLD2 switches to the low logic state after node LD2.

In addition, NMOS transistor 34' is designed to be more resistive than NMOS transistor 16' (for example by selecting a different dimensional ratio W/L); thereby the bias voltage of the drain terminal of reference cell 30 is lower than the bias voltage of the drain terminal 4a of each data cell 4, for the same read bias signal UC and read activation signal UGV, the current in reference cell 30 is lower than that in data cell 4, and node DLD1 is grounded more slowly than node LD1.

Finally, by using appropriate dimensions for NMOS transistors 71, 75 of data storage circuit 18' and reference storage circuit 36', and more specifically by making NMOS transistor 75 more conductive than NMOS transistor 71, for a same current in data cell 4 and reference cell 30, a smaller drop is obtained on transistor 75 than on transistor 71. Consequently the voltage on node LD1 reaches the trigger value of inverter 39' more slowly than the voltage on node DLD1. These three factors together thus contribute towards guaranteeing correct functioning of the device.

FIG. 8 shows a simulation of the plot of read bias signal UC, read activation signal UGV, initialization signal POR, supply voltage $V_{DD}$, and the voltages on nodes LD1, LD2, DLD1 and DLD2 as can be obtained with the above-described reading device 1'.

As can be seen, even if voltage switching on nodes LD1, LD2, DLD1 and DLD2 takes place before signals UGV and UC reach the full value equal to the supply voltage $V_{DD}$, the transition sequence of these voltages is maintained, and the conditions indicated for correct functioning in all situations are maintained.

Finally, it is apparent that changes and variants can be made to the reading device 1' described and illustrated here, without departing from the scope of the present invention.

For example, in reference storage circuit 36' of FIG. 7, to reduce the bias voltage of the drain terminal of reference cell 30, instead of making transistor 34' more resistive than transistor 16', it is possible to make the dimensions of reference cell 30 such that its conduction threshold voltage is increased, thus reducing, for a same read activation signal UGV, the current absorbed by the reference cell 30. However, this solution would mean losing at least part of the correlation of the variations of the structural features, and deterioration of the latter between data cells 4 and reference cell 30. In addition, the measures specified for guaranteeing completion of the reading step only when all virgin data cells 4 have been read (physical arrangement in FIG. 4: reduction of the bias voltage on the drain terminal of reference cell 30; increase of the current necessary to take the voltage on node DLD2 from $V_{DD}$ so as to trigger inverter 39'; and decrease of the trigger threshold of inverter 39' to extend the voltage range of signal DLD2) do not require simultaneous implementation, and can be implemented other than as shown.

We claim:

1. A method for reading a non-erasable memory cell, comprising the steps of:

detecting a predetermined switching edge of an initialization signal;

generating a read activation signal for said memory cell; and generating a read bias signal for said memory cell when said predetermined switching edge of said initialization signal is detected, wherein said step of generating a read activation signal is carried out after said predetermined switching edge of said initialization signal is detected.

2. A method according to claim 1 wherein said read activation signal and read bias signal have a respective first ramp-like switching edge.

3. A method according to claim 2 wherein said first switching edge of said read activation signal is slightly ahead of or simultaneous with said first switching edge of said read bias signal.

4. A method according to claim 2 wherein said method further comprises the steps of:
   detecting a predetermined switching edge of a deactivation signal, and
   generating a second switching edge of said read bias signal and of said read activation signal, which is opposite and subsequent to said respective first switching edges, when said predetermined switching edge of said deactivation signal is detected.

5. A method according to claim 4 wherein said second switching edge of said read bias signal is slightly ahead of or at the most simultaneous with said second switching edge of said read activation signal.

6. A device for reading a non-erasable memory cell, comprising control means having an input receiving an initialization signal, a first output supplying a read activation signal and a second output supplying a read bias signal for said memory cell, wherein said control means comprises switching detection means having a first input connected to said input of said control means and an output, first generator means connected to said output of said switching detection means and to said first output of said control means, and supplying said read activation signal when a predetermined switching edge of said initialization signal is detected, and second generator means connected to said output of said switching detection means and to said second output of said control means, and supplying said read bias signal when said predetermined switching edge of said initialization signal is detected.

7. A device according to claim 6 wherein said first and second generator means are arranged in series with one another between a first and a second reference potential line, and comprise a plurality of switch means in series with one another, said switch means of said first generator means having resistive behavior.

8. A device according to claim 6 wherein said switching detection means comprise a second input receiving a deactivation signal and deactivation means connected to said first and second generator means for deactivating the first and second generator means when a predetermined switching edge of said deactivation signal is detected.

9. A device according to claim 7 wherein said control means comprises connection means interposed between said second generator means and said second reference potential line, and comprises own switch means having a control input connected to the output of said switching detection means, and in that said switch means of said first generator means are of a complementary type to said switch means of said connection means.

10. A device according to claim 9 wherein said switch means comprise MOS transistors.

11. A device according to claim 6, further comprising a cell read circuit including a data read bias circuit and a data storage circuit connected to a data cell, a read detection circuit including a non-erasable reference cell and a reference read circuit, said reference read circuit including a reference read bias circuit and a reference storage circuit.

12. A device according to claim 11 wherein said reference read bias circuit provides said reference cell with a bias voltage which has a lower value than the bias voltage provided by said data read bias circuit to said data cell.

13. A device according to claim 12 wherein said data read bias circuit and reference circuit each comprises a bias transistor, said bias transistor of said reference read bias circuit being more resistive than said bias transistor of said data read bias circuit.

14. A device according to claim 11 wherein said reference storage circuit has a read trigger voltage with a lower value than said data storage circuit.

15. A device according to claim 14 wherein said data storage circuit and reference storage circuit each comprise a latch circuit including transistors, said transistors of said data storage circuit having threshold values different from said transistors of said reference storage circuit.

16. A device according to claim 11 wherein said reference storage circuit has a read trigger current greater than said data storage circuit.

17. A device according to claim 16 wherein said data storage circuit and reference storage circuit each comprise a first and a second inverter connected back-to-back, each said first inverter having an output connected to a respective read bias circuit, a pull-up transistor and a pull-down transistor connected together in series, said pull-up transistor of said reference storage circuit being more conductive than said pull-up transistor of said data storage circuit.

18. A device according to claim 11 wherein a distance between said read detection circuit and said control circuit is greater than a distance between said read detection circuit and said data read circuit.

19. A device for reading a non-erasable memory cell, comprising:
   a control circuit, said control circuit having a first input receiving an initialization signal, a first output supplying a read activation signal, and a second output supplying a read bias signal, said control circuit being structured to supply said read activation signal and said read bias signal in response to detecting a predetermined switching edge of the initialization signal; and
   a cell read circuit for reading a logic state of the non-erasable memory cell in response to the read activation and read bias signals, said cell read circuit being connected to said control circuit and having an output providing a reading result of the memory cell.

20. The control circuit of claim 19, comprising:
   a switching detection circuit having a first input connected to said first input of the control circuit, a second input connected to said second input of the control circuit, and an output;
   a first generator circuit connected between said output of the switching detection circuit and the first output of the control circuit;
   a second generator circuit connected between the first and second outputs of the control circuit, said second generator circuit being further connected to said first generator circuit; and
   a connection circuit connected to the second generator circuit, said connection circuit having a control input connected to the output of said switching detection circuit.

21. The control circuit of claim 20 wherein said first and said connection circuit include a plurality of switch circuits connected in series with one another between a first and a second voltage references, and said connection circuit comprises at least one switch circuit having a control input connected to the output of said switching detection circuit, and said switch circuits of the first generator circuit having resistive behavior, and said switch circuit of the connection circuit is of the complementary type to said switch circuits of the first generator circuit.

22. The control circuit of claim 20 wherein the switching detection circuit comprises:
   a NOR gate circuit having a first and a second inputs respectively receiving the initialization signal and a deactivation signal and an output; and an inverter circuit having an input connected to the output of the NOR gate circuit, and an output constituting the switching detection circuit output.

23. The control circuit of claim 20 wherein the first generator circuit has a first and a second PMOS transistors connected in series to each other, and the connection circuit has a first and a second NMOS transistors connected in series to each other, said first PMOS and first NMOS transistors respectively having a control input connected to the output of said switching detection circuit, and said second PMOS and second NMOS transistors each having a control input respectively connected to a write bias signal and an inverted write bias signal, the second generator circuit comprising a CMOS switch circuit having a first and a second control terminals respectively receiving the write bias signal and the inverted write bias signal.

24. The device of claim 19 wherein the cell read circuit comprises:
- a non-erasable memory cell having a control input connected to the first output of the control circuit;
- a data read bias circuit connected to the non-erasable memory cell, said data read bias circuit having a control input connected to the second output of the control circuit;
- a data storage circuit having a first terminal connected to the data read bias circuit, and a second terminal connected to the output of the cell read circuit, said data storage circuit being connected between the first and the second voltage references; and
- a first initialization circuit connected between the second terminal of the data storage circuit and the second voltage reference, said first initialization circuit having a control terminal receiving the initialization signal.

25. The device of claim 24, further comprising a read detection circuit including:
- a non-erasable reference cell having a control input connected to the first output of the control circuit;
- a reference read bias circuit connected to the non-erasable reference cell, said reference read bias circuit having a control input connected to the second output of the control circuit;
- a reference storage circuit having a third terminal connected to the reference read bias circuit and a fourth terminal, said reference storage circuit being connected between the first and the second voltage references; and
- a second initialization circuit connected between the fourth terminal of the reference storage circuit and the second voltage reference, said second initialization circuit having a control terminal receiving the initialization signal.

26. The device of claim 25 wherein the non-erasable memory and the non-erasable reference cells respectively comprises a non-volatile MOS transistor, the data read bias and the reference read bias circuits respectively comprises a MOS transistor, and the first and the second initialization circuits respectively comprises a MOS transistor each having a control terminal receiving the initialization signal.

27. The device of claim 25 wherein said data storage circuit comprises a first and a second inverter circuits connected back-to-back to one another and in parallel between the first and the second voltage references, and said reference storage circuit comprises a third and a fourth inverter circuits connected back-to-back to one another and in parallel between the first and the second voltage references.

28. The read detection circuit of claim 25, further comprising a delay circuit connected between the fourth terminal of the reference storage circuit and the output of the read detection circuit, said delay circuit having a plurality of inverter circuits.

29. The device of claim 25 wherein a first connection distance between the read detection circuit and the control circuit is greater than a second connection distance between the cell read circuits and the control circuit, and the a bias voltage on the non-erasable reference cell is lower than a bias voltage on the non-erasable memory cell.

30. The device of claim 25 wherein the data read bias circuit comprises a first bias transistor and the reference read bias circuit comprises a second bias transistor, said second bias transistor being more resistive than the first bias transistor.

* * * * *